(12) United States Patent
Chang et al.

(10) Patent No.: US 6,972,623 B2
(45) Date of Patent: Dec. 6, 2005

(54) DIFFERENTIAL AMPLIFIER WITHOUT COMMON MODE FEEDBACK

(75) Inventors: Chih-Chiang Chang, Taipei (TW); Chien-Hung Chen, Taipei (TW)

(73) Assignee: Taiwan Semiconductor Manufacturing Co., Ltd., (TW)

(*) Notice: Subject to any disclaimer, the term of this patent is extended or adjusted under 35 U.S.C. 154(b) by 0 days.

(21) Appl. No.: 10/800,262

(22) Filed: Mar. 11, 2004

(65) Prior Publication Data

US 2005/0200411 A1   Sep. 15, 2005

(51) Int. Cl.[7] .................................................. H03F 3/45
(52) U.S. Cl. ...................................... 330/253; 330/261
(58) Field of Search ............................... 330/253, 254, 330/257, 258, 261; 327/359

(56) References Cited

U.S. PATENT DOCUMENTS

| 6,304,141 B1 * | 10/2001 | Kennedy et al. ............. 330/253 |
| 6,791,415 B2 * | 9/2004 | Mitteregger ................. 330/260 |
| 6,798,293 B2 * | 9/2004 | Casper et al. ............... 330/258 |

* cited by examiner

*Primary Examiner*—Henry Choe
(74) *Attorney, Agent, or Firm*—Duane Morris LLP

(57) ABSTRACT

A differential amplifier without common feedback is disclosed. The amplifier has a low gain fully differential amplifier and a high gain fully differential amplifier connected in parallel with the low gain fully differential amplifier. When first and second inputs feed into the low and high gain fully differential amplifiers, the low gain fully differential amplifier is used to bias the high gain fully differential amplifier so that a first and second voltage output generated by the high gain fully differential amplifier is stable during a common mode operation without being impacted by fluctuation of the inputs.

18 Claims, 7 Drawing Sheets

DIFFERENTIAL AMPLIFIER WITHOUT COMMON MODE FEEDBACK

BACKGROUND OF INVENTION

The present disclosure generally relates to semiconductor devices, and more particularly to fully differential amplifiers. Still more particularly, the present disclosure relates to the method for a fully differential amplifier without common mode feedback circuit and increasing a fully differential amplifier's gain and unit gain bandwidth through a parallel fully differential amplifier.

An amplifier is an electronic circuit containing transistors or integrated circuits that provide a voltage gain. It may also provide a current gain, power gain, or impedance transformation. Since it is a basic part of almost every electronic application, the amplifier is an essential circuit that is used in numerous applications.

A fully differential amplifier circuit is a special type of amplifier that has two inputs and two outputs. This device amplifies input signals on the two input lines that are out of phase and rejects input signals that have a common phase such as induced noise. This allows amplification and isolation of the desired signals and removal of unwanted signals such as noise. Noise can be generated in a system by stray magnetic fields that induce voltages in a system's ground or signal lines. The distinguishing feature of noise signals is that they appear equally and in phase (common signals) at the input of the fully differential amplifier circuit. A measure of the rejection by the fully differential amplifier of signals common to both inputs is called "common mode rejection."

A fully differential amplifier incorporates a balanced differential amplifier circuit that has common mode feedback. A typical fully differential amplifier has two inputs and two outputs. The common mode feedback is accomplished by the use of a common mode feedback circuit that monitors the two differential amplifier output lines and provides a feedback signal that adjusts the amplifier's bias current, thereby rejecting the unwanted common mode signals on the amplifier's output.

A disadvantage of the monitoring of the fully differential amplifier's output by the common mode feedback circuit is that it loads the output and reduces the overall amplifier gain as well as the amplifier gain bandwidth. Also, additional power consumption and device space is needed for the common mode feedback circuit.

Desirable in the art of fully differential amplifier design are improved designs that eliminate common mode feedback circuit, and reduce area, power consumption and bandwidth.

SUMMARY

In view of the foregoing, this disclosure provides a method to improve fully differential amplifier performance through a parallel fully differential amplifier.

In one example, the circuit comprises a first fully differential amplifier connected in parallel to a second fully differential amplifier, wherein the positive input of the first fully differential amplifier is connected to the positive input of the second fully differential amplifier, wherein the negative input of the first fully differential amplifier is connected to the negative input of the second fully differential amplifier. A voltage bias signal is connected to current source terminals of the first and second fully differential amplifiers. The negative and the positive outputs of the first fully differential amplifier are connected to the positive and the negative load terminals, respectively, of the second fully differential amplifier. The negative and the positive outputs of the second fully differential amplifier are connected to the negative and the positive outputs, respectively, of the circuit, wherein the first amplifier is a low gain amplifier and the second amplifier is a high gain amplifier.

Various aspects and advantages will become apparent from the following detailed description, taken in conjunction with the accompanying drawings, illustrating the principles of the disclosure by way of examples.

DESCRIPTION

In the present disclosure, a parallel fully differential amplifier device and its associated circuitry are disclosed.

Figure 1:
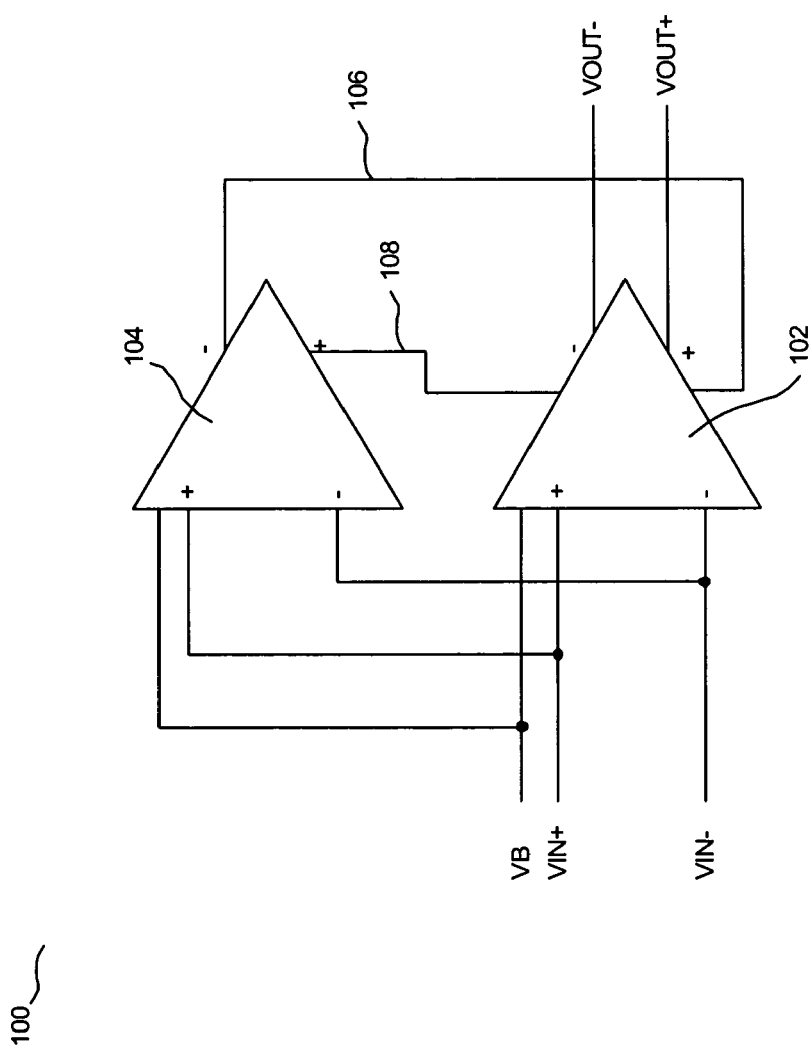
FIG. 1 illustrates a simplified block diagram of a parallel fully differential amplifier in accordance with one example of the present disclosure.

FIG. 1 illustrates a simplified block diagram of a parallel fully differential amplifier device 100 using a high gain fully differential amplifier 102 and a low gain fully differential amplifier 104. A positive differential input signal VIN+ is connected to the positive input terminals of both amplifiers 102 and 104. A negative differential input signal VIN− is connected to the negative input terminals of both amplifiers 102 and 104. The negative and positive output terminals of the fully differential amplifier 102 are tied to two output signals VOUT− and VOUT+, respectively. A connection 106 connects the negative output terminal of amplifier 104 to the positive load terminal of amplifier 102 such that VOUT+ is adjusted by biasing active current load through variations in the negative output terminal of amplifier 104. Similarly, a connection 108 connects the positive output terminal of amplifier 104 to the negative load terminal of amplifier 102 such that VOUT− is adjusted by biasing active current load through variations in the positive output terminal of amplifier 104. A voltage bias signal VB is usually feeding into voltage bias terminals of the two amplifiers.

By using the outputs of amplifier 104 to bias active current load of amplifier 102, the device enables inherent common mode feedback that provides the fully differential amplifier's common mode rejection capability with no additional feedback circuitry. In addition, this method removes the output loading effects of amplifier 102 due to the additional feedback circuitry, thereby allowing increases in bandwidth.

Figure 2:
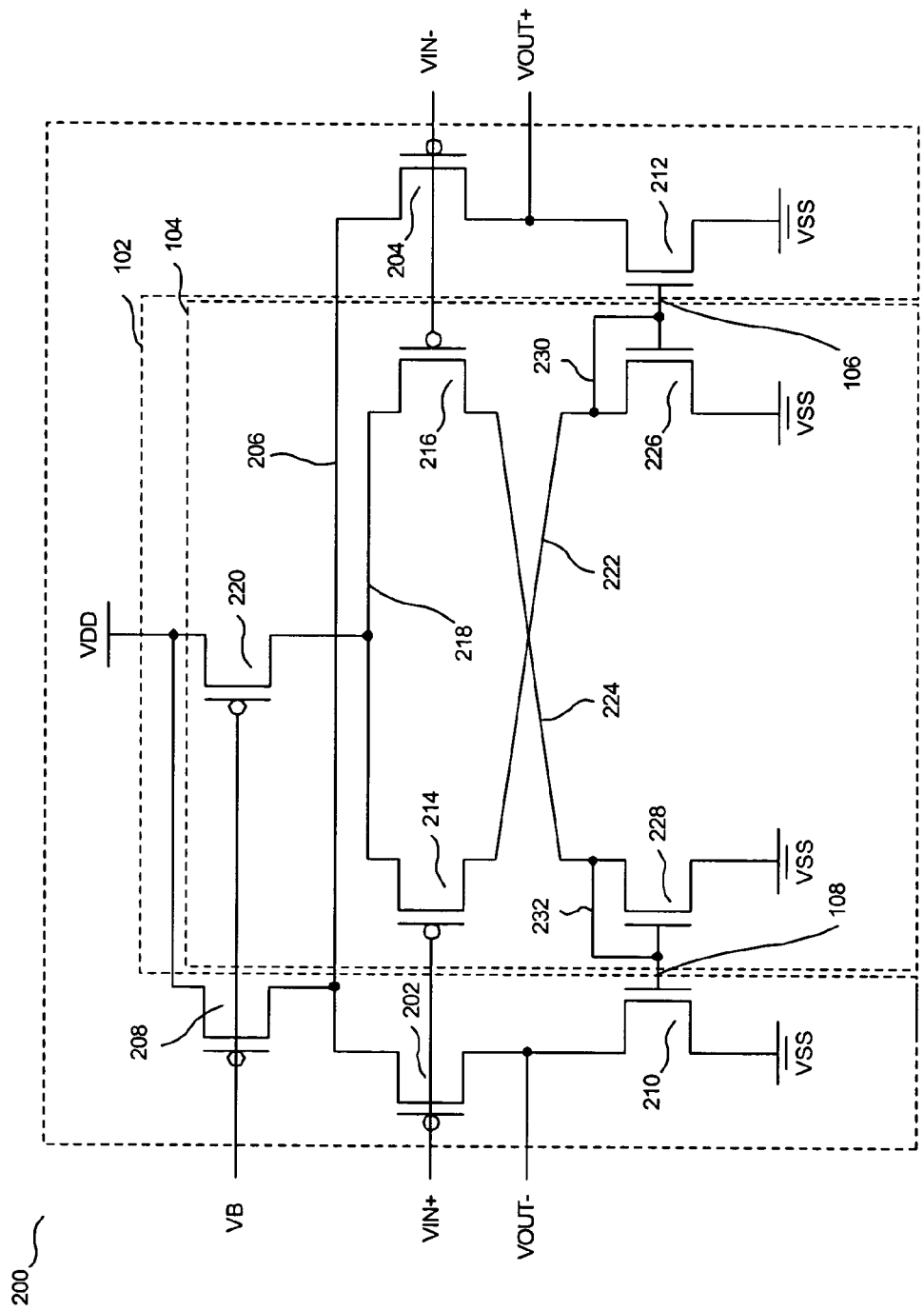
FIG. 2 illustrates a gate-level layout of the parallel fully differential amplifier in accordance with one example of the present disclosure.

FIG. 2 illustrates a sample gate-level layout 200 of the parallel fully differential amplifier device 100. The parallel fully differential amplifier device 100 includes two amplifiers 102 and 104 connected in parallel.

Amplifier 102 includes pMOS transistors 202 and 204 whose gates are connected to VIN+ and VIN−, respectively, and whose sources are coupled together through a connection 206. Bias voltage adjustment of amplifier 102 is achieved by applying bias voltage VB to the gate of a pMOS transistor 208, whose drain and source are connected to the connection 206 and VDD, respectively. In other words, a change in bias voltage of transistor 208 changes the bias current of transistors 202 and 204 via the connection 206. The transistor 208 can be viewed as a current source that provides current to two current paths, one goes down to transistor 202 and the other to transistor 204, and both eventually are directed down to VSS.

The drain of transistor 202 is connected to VOUT−, and further connected to the drain of an nMOS transistor 210. Transistors 202 and 210 together form a class AB balanced output stage for VOUT− to drive other external devices. The drain of transistor 204 is connected to VOUT+, and further connected to the drain of an nMOS transistor 212. Similar to transistors 202 and 210, transistors 204 and 212 together form a class AB balanced output stage for VOUT+ to drive other external devices. Finally, the sources of both transistors 210 and 212 are connected to VSS.

The amplifier 104 includes pMOS transistors 214 and 216 whose gates are connected to VIN+ and VIN−, respectively, and whose sources are coupled together through a connection 218. Bias voltage adjustment of amplifier 104 is achieved by applying bias voltage VB to the gate of a pMOS transistor 220, whose drain and source are connected to the connection 218 and VDD, respectively. The drains of transistors 214 and 216 are connected, via connections 222 and 224, respectively, to the drains of NMOS transistors 226 and 228, respectively. The drains of transistors 226 and 228 are also connected, via connections 230 and 232, to the gates of transistors 226 and 228, respectively. Since the gates of transistors 226 and 228 are connected to the drains which are the outputs of the amplifier, they can be referred to as self-biased loadings. Furthermore, similar to amplifier 102, transistor 220 can be viewed as a current source which provides current to go down through two split current paths, one to transistor 214 and the other to transistor 216.

Via connections 232 and 108, the positive output of amplifier 104 is able to bias active current load of the negative output of the amplifier 102 as a loading bias input to amplifier 102. Similarly, via connections 230 and 106, the negative output of amplifier 104 is able to bias active current load of the positive output of the amplifier 102.

Amplifier 102 generates positive common mode signals in VOUT+ and VOUT−, which can be cancelled through amplifier 104, which generates negative common mode signals in VOUT+ and VOUT−. The common mode DC signal can be kept constant due to load bias through connections 222 and 224. Therefore, a common mode feedback detector circuit is not necessary. Since circuit loading is smaller than a typical differential amplifier, a larger amplifier bandwidth is possible. The common mode rejection ratio (CMRR) is defined as the ratios of differential gain divided by common mode gain. The CMRR for the differential amplifier of this parallel architecture can be represented in the following equation:

$$CMRR=(g_{m1}+g_{m2}*g_{m3}/g_{m4})/(g_{m1}-g_{m2}*g_{m3}/g_{m4}) \quad \text{(Ratio1)}$$

where $g_{m1}$, $g_{m2}$, $g_{m3}$ and $g_{m4}$ are the transconductances at transistors 202, 210, 214 and 228, respectively.

Figure 3:
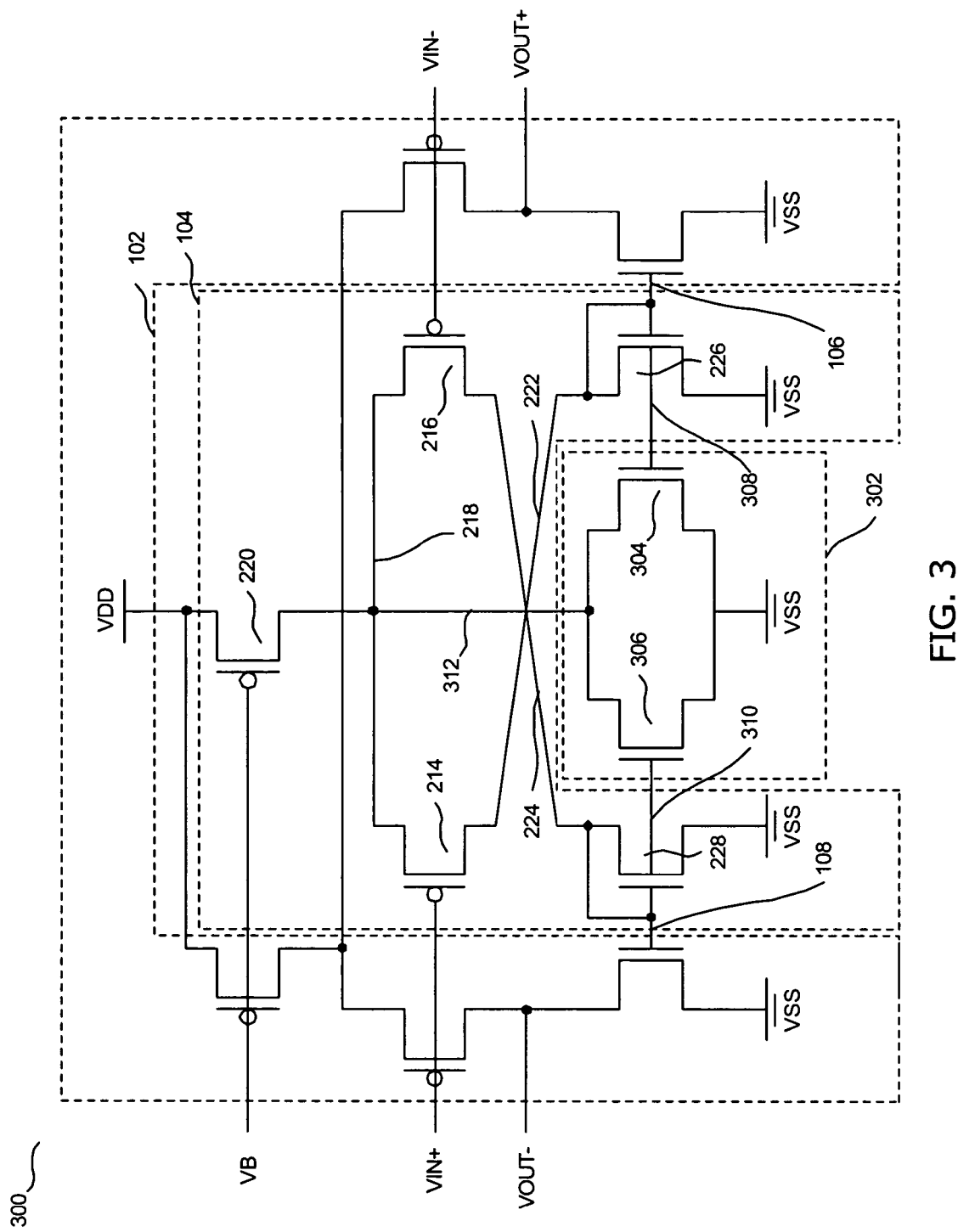
FIG. 3 illustrates a first embodiment of the parallel fully differential amplifier in accordance with one example of the present disclosure.

FIG. 3 illustrates a first embodiment 300 of the parallel fully differential amplifier device 100 by including a supplemental loading module such as an output level modification circuit 302. The output level modification circuit 302 includes nMOS transistors 304 and 306 that form a current mirror-type circuit. Transistors 304 and 306 are connected to transistors 226 and 228 of the amplifier 104 via connections 308 and 310, respectively. The drains of transistors 304 and 306 are coupled together and further connected, via a connection 312, to the connection 218. The sources of transistors 304 and 306 are connected to VSS. As such, the output level modification circuit 302 provides a current path parallel to the amplifier 104, thereby dividing the current of transistor 220 between transistors 214 and 216, and, through connection 312, the output level modification circuit 302. As such, the addition of output level modification circuit 302 reduces overall current going through the amplifier 104, thereby reducing the positive and negative outputs of the amplifier 104, and thereby allowing better control over the overall output level of embodiment 300.

Figure 4:
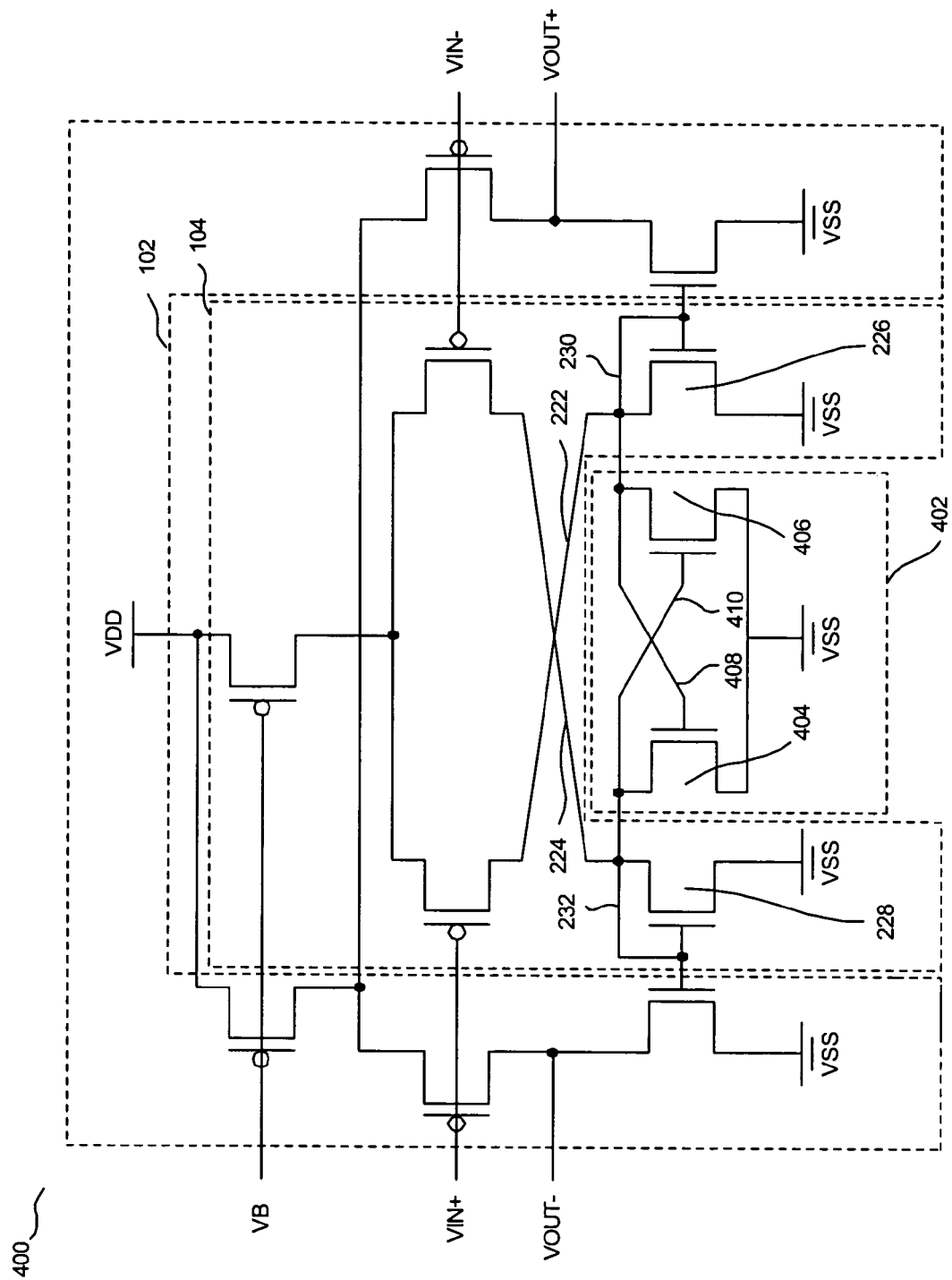
FIG. 4 illustrates a second embodiment of the parallel fully differential amplifier in accordance with one example of the present disclosure.

FIG. 4 illustrates a second embodiment 400 of the parallel fully differential amplifier device 100 by including a supplemental loading module such as a gain improvement modification circuit 402. The gain improvement modification circuit 402 includes nMOS transistors 404 and 406, whose sources are connected to VSS and whose gates are connected, respectively via connections 408 and 410, to connections 222 and 224, respectively. The drain of transistor 404 is connected to connection 410, while the drain of transistor 406 is connected to connection 408.

Since the gate of transistor 404 is controlled by the negative output of the amplifier 104 through connections 408 and 222, transistor 404 in turn provides a negative feedback to transistor 228 controlled by the positive output of the amplifier 104 through connection 232. Similarly, since the gate of transistor 406 is controlled by the positive output of the amplifier 104 through connections 410 and 224, transistor 406 in turn provides a negative feedback to transistor 226 controlled by the negative output of the amplifier 104 through connection 230.

By using the gain improvement modification circuit 402, gain and gain bandwidth can further be improved over device 100. Similar to device 100, common mode feedback detector circuit is not necessary since common mode signal VOUT− and VOUT+ can be kept constant due to load bias through connections 222 and 224. The gain of embodiment 400 is larger than the gain of the device 100 by the following ratio:

$$(g_{m1}+(g_{m2}*g_{m3})/(g_{m4}-g_{m5}))/(g_{m1}+(g_{m2}*g_{m3})/(g_{m4})) \quad \text{(Ratio2)}$$

where $g_{m1}$, $g_{m2}$, $g_{m3}$, $g_{m4}$ and $g_{m5}$ are the transconductances of transistors 202, 210, 214, 228 and 404, respectively. As long as $g_{m4}>g_{m5}$, Ratio2>1, thereby indicating that device 100 with the gain improvement modification circuit 402 has a larger gain than device 100 without the gain improvement modification circuit 402. Similarly, the gain bandwidth is also increased by the same ratio.

Figure 5:
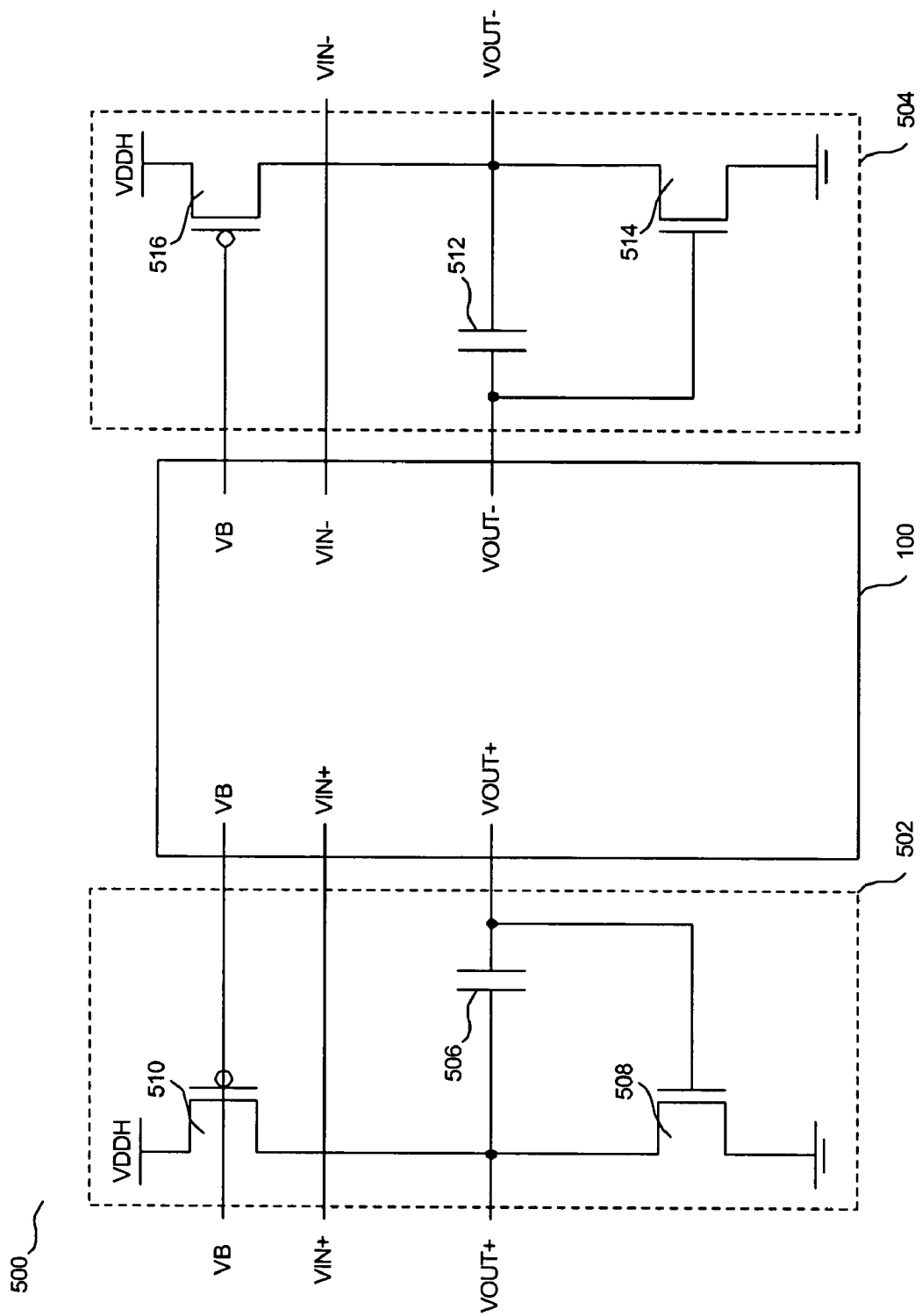
FIG. 5 illustrates a third embodiment of the parallel fully differential amplifier in accordance with one example of the present disclosure.

FIG. 5 illustrates a third embodiment 500 of the parallel fully differential amplifier device 100 by including two class A output stage modules 502 and 504 to increase the output voltage swing and the loading capacity at VOUT+ and VOUT−. Module 502 includes a capacitor 506, whose one end is connected to VOUT+ of device 100 and further connected to the gate of an nMOS transistor 508, and whose other end is connected to VOUT+ of the output stage module 502, the drain of transistor 508 and the drain of a pMOS transistor 510. Capacitor 506 provides phase compensation from VOUT+ of device 100 to VOUT+ of the output stage 502. The source of transistor 508 is connected to VSS. The gate of transistor 510 is connected to bias voltage VB, while the source of transistor 510 is connected to VDDH, which is a high voltage. With this high voltage, embodiment 500 may be used in high-gain, high-driving applications. For example, if VDDH carries a DC supply voltage more than 5V, it allows an output voltage swing of 4.5V.

Similarly, module 504 includes a capacitor 512, whose one end is connected to VOUT− of device 100 and further connected to the gate of an nMOS transistor 514, and whose other end is connected to VOUT− of the output stage module 504, the drain of transistor 514 and the drain of a pMOS transistor 516. Capacitor 514 provides phase compensation from VOUT− of device 100 to VOUT− of the output stage 504. The source of transistor 514 is connected to VSS. The gate and source of transistor 516 are respectively connected to bias voltage VB and VDDH.

Figure 6:
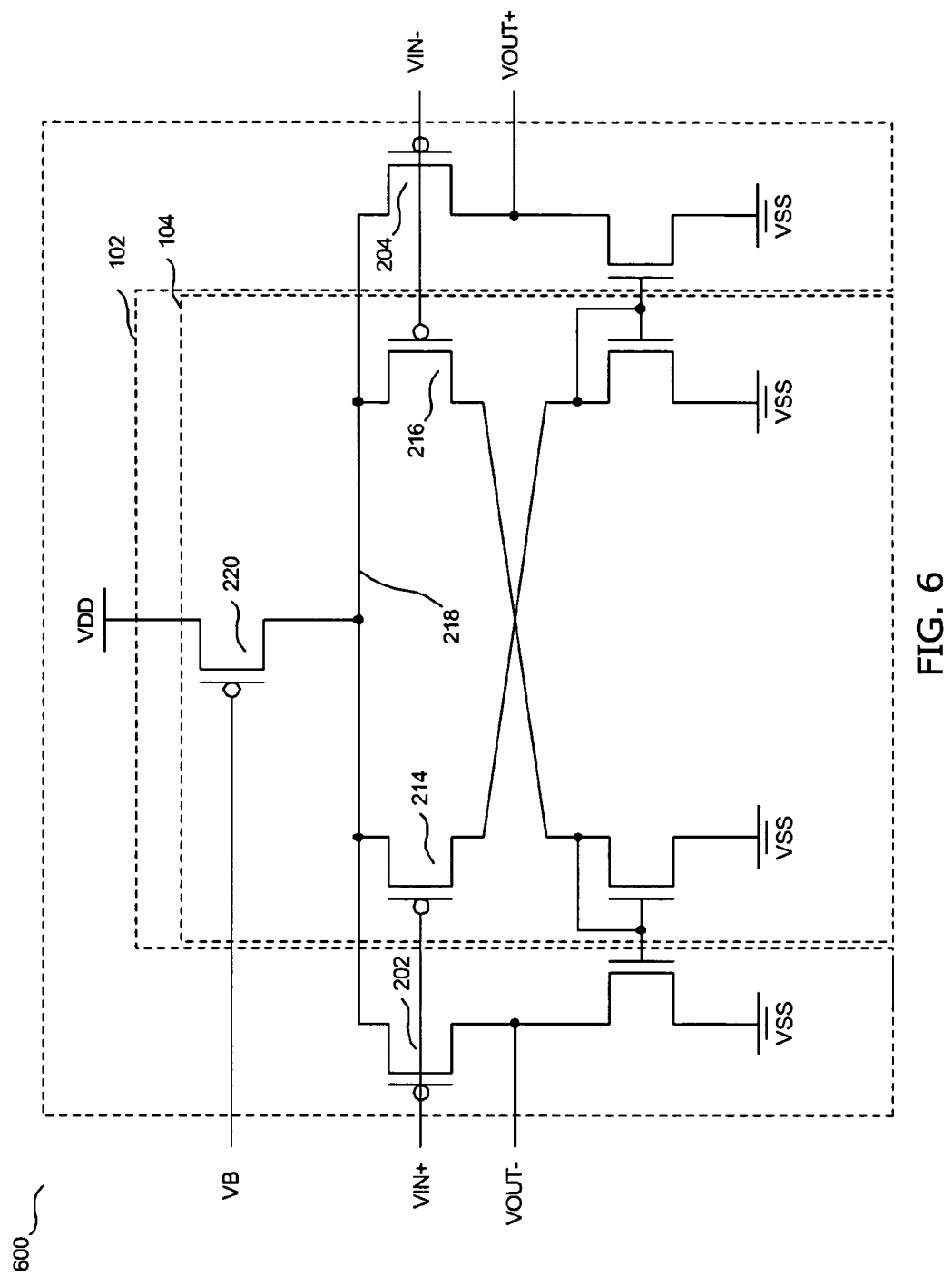
FIG. 6 illustrates a fourth embodiment of the parallel fully differential amplifier in accordance with one example of the present disclosure.

FIG. 6 illustrates a fourth embodiment 600 of the parallel fully differential amplifier device 100 by using a common current source such as the common source transistor 220. Compared to the layout in FIG. 2, transistor 208 is eliminated, while connections 206 and 218 are collapsed into one connection, or connection 218. The common source transistor 220 is connected, via the connection 206, to the sources of transistors 214 and 216 of the amplifier 104 and the sources of transistors 202 and 204 of the amplifier 102. As such, the input terminals of transistors 214, 216, 202 and 204 have the same gate-to-source bias voltage, thereby providing a better cancellation of common mode signal between the amplifier 102 and the amplifier 104.

Figure 7:
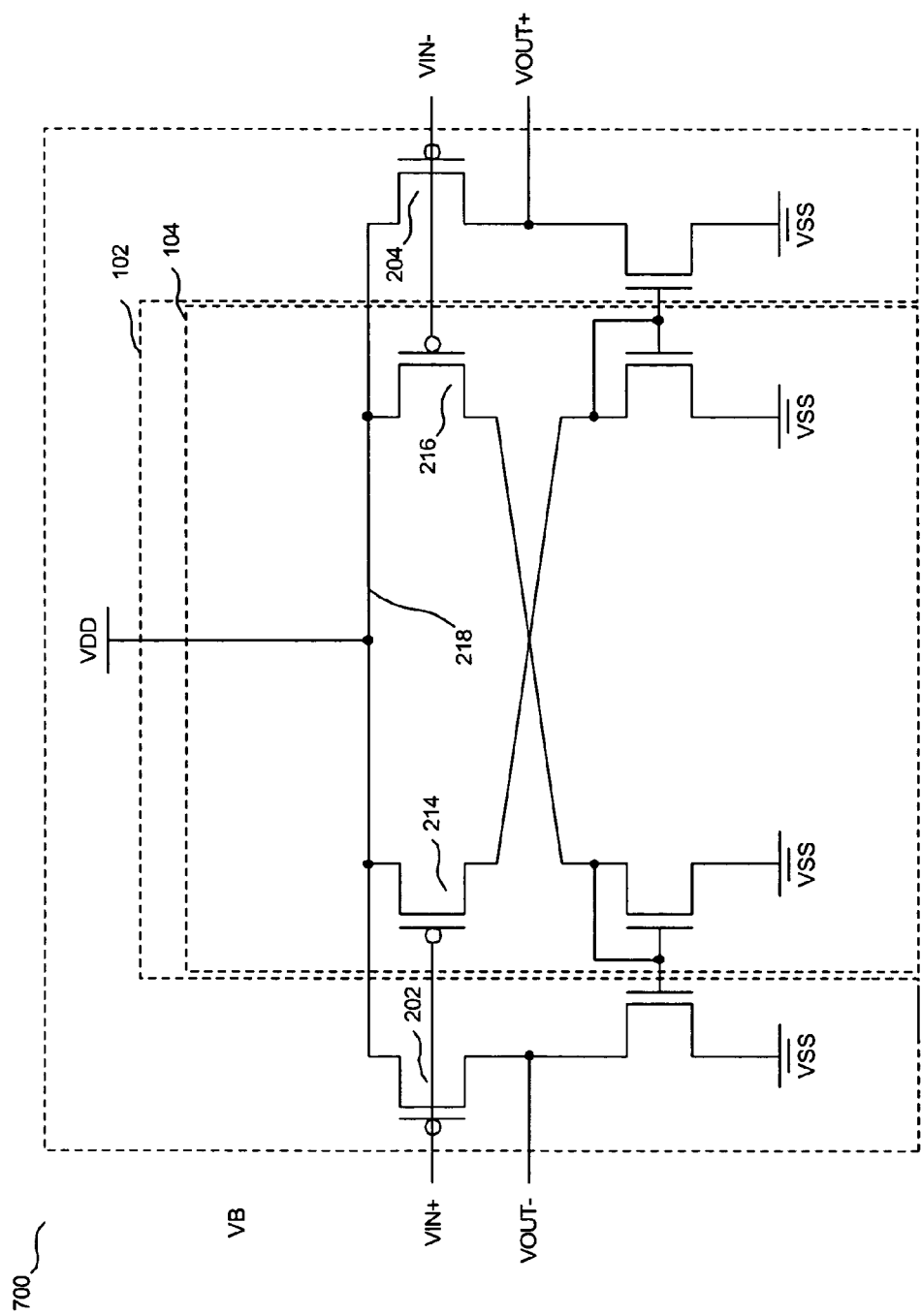
FIG. 7 illustrates a fifth embodiment of the parallel pseudo differential amplifier in accordance with one example of the present disclosure.

FIG. 7 illustrates a fifth embodiment of the parallel fully differential amplifier device 100. In this embodiment, a pseudo differential amplifier 700 is created by eliminating transistors 208 and 220, which are the current sources for the amplifiers 102 and 104, respectively. Also, connections 206 and 218 are collapsed into one connection, connection 218. The sources of transistors 202 and 204 of the amplifier 102, and the sources of transistors 214 and 216 of the amplifier 104 connect directly to VDD. As such, source-to-drain voltage drop at transistors 208 and 220 can be removed, thereby allowing a lower operation voltage than device 100. This design can be used in low voltage applications.

The above disclosure provides many different embodiments, or examples, for implementing different features of the disclosure. Specific examples of components, and processes are described to help clarify the disclosure. These are, of course, merely examples and are not intended to limit the disclosure from that described in the claims.

Although illustrative embodiments of the disclosure have been shown and described, other modifications, changes, and substitutions are intended in the foregoing disclosure. Accordingly, it is appropriate that the appended claims be construed broadly and in a manner consistent with the scope of the disclosure, as set forth in the following claims.

What is claimed is:

1. A differential amplifier circuit comprising:
   a low gain fully differential amplifier; and
   a high gain fully differential amplifier connected in parallel with the low gain fully differential amplifier with a positive input of the low gain fully differential amplifier being connected to a positive input of the high gain fully differential amplifier and connected to a positive input of the circuit, with a negative input of the low gain fully differential amplifier being connected to a negative input of the high gain fully differential amplifier and connected to a negative input of the circuit, negative and positive outputs of the low gain fully differential amplifier being connected to positive and negative load terminals, respectively, of the high gain fully differential amplifier,
   wherein negative and positive outputs of the high gain fully differential amplifier become negative and positive outputs, respectively, of the circuit, and
   wherein when the low gain fully differential amplifier biases the high gain fully differential amplifier, the positive and negative outputs of the circuit are stable during a common mode operation without being impacted by a fluctuation of the inputs.

2. The amplifier of claim 1 wherein the low gain fully differential amplifier further includes:
   at least one current source coupled to first and second differential current paths for receiving the positive and negative inputs;
   a first self-biased loading in the first current path controlled by the positive input for generating the negative output thereof as a first loading bias input of the high gain differential amplifier for generating the positive output of the circuit; and
   a second self-biased loading in the second current path controlled by the negative input for generating the positive output thereof as a second loading bias input of the high gain differential amplifier for generating the negative output of the circuit.

3. The amplifier of claim 2 wherein the positive and negative inputs control the current paths by controlling gates of two pMOS transistors in the current paths.

4. The amplifier of claim 2 wherein the current source is a pMOS transistor connected to a supply voltage.

5. The amplifier of claim 2 wherein the low gain fully differential amplifier further includes a supplemental loading module for diverting current coming into the first and second differential current paths.

6. The amplifier of claim 5 wherein the supplemental loading module is an output level modification module with a current mirror type circuit sharing the current source with the two differential current paths for modifying levels of the positive and negative outputs.

7. The amplifier of claim 6 wherein the output level modification module has two nMOS transistors connected in parallel whose drains are connected to the current source.

8. The amplifier of claim 5 wherein the supplemental loading module is a gain improvement module for increasing the gain of the positive and negative outputs.

9. The amplifier of claim 8 wherein the gain improvement module has first and second nMOS transistors cross connected with each gate connected to the other's drain for sharing the current in the two differential current paths.

10. The amplifier of claim 1 wherein the high gain fully amplifier further includes:
    at least one current source passing current along first and second differential current paths,
    wherein the first differential current path having a first pMOS transistor with its gate controlled by the positive input and a first nMOS transistor connected in series with a gate thereof connected to the positive output of the low gain fully differential amplifier, and the second differential current path having a second pMOS transistor with its gate controlled by the negative input and a second nMOS transistor connected in series with a gate thereof connected to the negative output of the low gain fully differential amplifier, wherein a drain of the second nMOS transistor generates the positive output of the circuit and a drain of the first nMOS transistor generates the negative output of the circuit.

11. The amplifier of claim 1 further comprising first and second output stage modules for the positive and negative outputs of the circuit for increasing an output swing and loading capacity.

12. The amplifier of claim 11 wherein each of the first and second output stage modules has a pMOS transistor connected to a high voltage supply with its gate controlled by a bias voltage, an nMOS transistor connected in series with the pMOS transistor with its gate controlled by the corresponding positive or negative output of the circuit, and a capacitor providing an AC coupling to pass the corresponding positive or negative output.

13. The amplifier of claim 1 wherein the low and high gain fully differential amplifiers share at least one current source coupled to first and second differential current paths of both the low and high gain fully differential amplifiers.

14. The amplifier of claim 13 wherein the low gain fully differential amplifier further includes:
a first self-biased loading in the first current path controlled by the positive input for generating the negative output thereof as a first loading bias input of the high gain differential amplifier for generating the positive output of the circuit; and
a second self-biased loading in the second current path controlled by the negative input for generating the positive output thereof as a second loading bias input of the high gain differential amplifier for generating the negative output of the circuit.

15. The amplifier of claim 13 wherein the positive and negative inputs control the current paths by controlling gates of two pMOS transistors in the current paths.

16. The amplifier of claim 13 wherein the low gain fully differential amplifier further includes a supplemental loading module for diverting current coming into the first and second differential current paths.

17. The amplifier of claim 13 wherein the first differential current path in the high gain fully amplifier has a first pMOS transistor with its gate controlled by the positive input and a first NMOS transistor connected in series with a gate thereof connected to the positive output of the low gain fully differential amplifier, and wherein the second differential current path has a second pMOS transistor with its gate controlled by the negative input and a second nMOS transistor connected in series with a gate thereof connected to the negative output of the low gain fully differential amplifier, wherein a drain of the second nMOS transistor generates the positive output of the circuit and a drain of the first nMOS transistor generates the negative output of the circuit.

18. The amplifier of claim 13 further comprising first and second output stage modules for the positive and negative outputs of the circuit for increasing an output swing and loading capacity.

* * * * *